United States Patent [19]

Schouhamer Immink

[11] Patent Number: 5,774,077
[45] Date of Patent: Jun. 30, 1998

[54] ENCODING ARRANGEMENT AND METHOD FOR ENCODING(N-1)-BIT INFORMATION WORDS INTO N-BIT CHANNEL WORDS AND DECODING ARRANGEMENT AND METHOD FOR DECODING THE CHANNEL WORDS INTO INFORMATION WORDS

[75] Inventor: Kornelis A. Schouhamer Immink, Eindhoven, Netherlands

[73] Assignee: U.S. Philips Corporation, New York, N.Y.

[21] Appl. No.: 595,534

[22] Filed: Feb. 2, 1996

[30] Foreign Application Priority Data

Feb. 8, 1995 [EP] European Pat. Off. .............. 95200305

[51] Int. Cl.$^6$ ............................................ H03M 7/46
[52] U.S. Cl. ............................................... 341/50; 341/59
[58] Field of Search ................................ 341/50, 59, 58, 341/106, 67, 69

[56] References Cited

U.S. PATENT DOCUMENTS 4,539,691  9/1985  Ogawa et al. ............................. 375/37
5,142,421  8/1992  Kahlman et al. ......................... 360/40

*Primary Examiner*—Jeffrey A. Gaffin
*Assistant Examiner*—Peguy JeanPierre

[57] ABSTRACT

Encoding arrangement and method for encoding (n-1) information words into n-bit channel words and decoding arrangement and method for decoding the channel words into information words. The encoding arrangement is to obtain a channel signal of concatenated channel words comprising a bit sequence having at most k 'zeroes' between 'ones'. The encoding arrangement comprises input means for receiving the (n-1)-bit information words, converting means for converting the (n-1) bit information words into n-bit channel words and output means for supplying the channel signal. A corresponding decoding arrangement is also disclosed.

45 Claims, 8 Drawing Sheets

ENCODING ARRANGEMENT AND METHOD FOR ENCODING (N-1)-BIT INFORMATION WORDS INTO N-BIT CHANNEL WORDS AND DECODING ARRANGEMENT AND METHOD FOR DECODING THE CHANNEL WORDS INTO INFORMATION WORDS

BACKGROUND OF THE INVENTION

The invention relates to an encoding arrangement for encoding (n-1)-bit information words into n-bit channel words so as to obtain a channel signal of concatenated channel words, the channel signal being a bit sequence having the virtue that at most k 'zeroes' between 'ones' occur, and to a decoding arrangement for decoding the channel words into information words, and to corresponding encoding and decoding methods.

An encoding arrangement as defined in the opening paragraph is known from USP 5,142,421 (PHN 13.537). In the known arrangement, one bit is added at the beginning or the end of an (n-1)-bit information word so as to obtain an n-bit channel word. In this way a DC free channel signal can be obtained or a pilot signal can be added to the channel signal that can be used for tracking purposes. In order to satisfy the k-constraint, it is necessary to look across the boundaries of subsequent channel words in order to determine the choice of the 1-bit to be added.

SUMMARY OF THE INVENTION

The encoding arrangement in accordance with the invention aims at providing a more simple encoding of the information words into channel words. To that purpose, the encoding arrangement is characterized in that the converting means comprises —inserting means for inserting one bit of a first or a second binary value in between a specified first and a second neighbouring bit position in the (n-1)-bit information words, a 'zero' bit being inserted in between said specified first and second neighbouring position in a (n-1)-bit information word if the number of leading 'zeroes' at the leading end of the information word exceeds a specified first integer number, or the number of trailing 'zeroes' at the trailing end of the information word exceeds a specified second integer number, —setting means for setting the logical value in a specified third bit position into a 'one' value if the number of leading 'zeroes' exceeds said specified first number, and for setting the logical value in a specified fourth bit position into a 'one' value if the number of trailing 'zeroes' exceeds said specified second number, the specified third bit position being one of a specified third number of leading bit positions of the information word, the specified fourth bit position being one of a specified fourth number of trailing bit positions of the information word, the specified third number being equal to the specified first number plus one, the specified fourth number being equal to the specified second number plus one, n and k being integer values and the specified first and second numbers having a relationship with k. Further, the encoding arrangement is characterized in that the inserting means are further adapted to insert a 'zero' bit in between said specified first and second neighbouring position if a group of more than k consecutive bit positions in the information word comprise all 'zeroes', the said group of more than k consecutive bit positions not comprising both the specified first and second bit positions, and in that the inserting means are further adapted to insert a 'one' bit in between said specified first and second neighbouring bit positions, otherwise. The encoding arrangement in accordance with the invention is based on the recognition to encode each information word separately without having knowledge of a previous or a subsequent information word. In a normal situation, a 'one'-bit is inserted in between a specified first and second bit position in the information word. This insertion can be done exactly in the middle of the information word. As a result, the maximum number of consecutive 'zeroes' in the information word is (n-1)/2, assuming (n-1) being even. If, however, the information word starts with a number of leading 'zeroes' or ends with a number of trailing 'zeroes', it can happen that the k-constraint will be violated when concatenating subsequent channel words. The leading 'zeroes' are defined as being the 'zeroes' in the information word preceding the first 'one' in the information word and the trailing 'zeroes' are defined as being the 'zeroes' following the last 'one' in the information word. Therefore, if the number of leading 'zeroes' exceeds a specified first number, the 'zero' in one bit position (the specified third bit position) in said array of leading 'zeroes' is changed into a 'one' bit. More specifically, the third bit position is the leading bit position of the information word. In the same way, if the number of trailing 'zeroes' exceeds a specified second number, the 'zero' in one bit position (the specified fourth bit position) in said array of trailing 'zeroes' is changed into a 'one' bit. More specifically, the fourth bit position is the final bit position of the information word.

It will be clear that the specified first and second numbers have a relationship with k. More specifically, k equals the sum of the specified first and second numbers.

Further, in the case that k is smaller than (n-1)/2, again assuming (n-1) being even and the added bit being added exactly in the middle of the information word, it may occur that a violation of the k-constraint takes place in the 'first half' or 'second half' of the information word because of the fact that a group of more than k consecutive bit positions in either the 'first half' or the 'second half' of the information word or both comprise all 'zeroes'. It will be appreciated that the added bit need not divide the information word in exactly a 'first half' and a 'second half' and that still a group of more than k consecutive 'zeroes' may occur in the 'first half', defined in the claims as 'the leading side of the information word', and the 'second half', defined in the claims as 'the trailing side of the information word'.

In order to avoid a violation of the k-constraint when such a group of consecutive 'zeroes' is present within an information word, the third (and fourth) bit position is preferably chosen such that it also lies within said group of bit positions, so that by inserting a 'one' bit in that bit position the said violation of the k-constraint by said group is also avoided.

Upon decoding, the added bit in the channel words received should be deleted in order to obtain converted channel words. Further, if the logical value of the added bit appears to be a 'one' value, the converted channel word thus obtained can be supplied as the generated information word. However, if the logical value of the added bit appears to be 'zero', at least the logical values in the third and/or fourth bit position should further be set to 'zero' in order to obtain the regenerated information word.

The encoding arrangement is further characterized in that said setting means are further adapted to set the logical value in a specified fifth bit position in said (n1)-bit information word into a 'one' value if the number of leading 'zeroes' exceeds said specified first number. This enables a decoder to identify whether the number of leading 'zeroes' in the original information word exceeded the specified first number, or not. If so, it can reverse the binary value in the specified third bit position of the channel word received into a 'zero' bit value.

The encoding arrangement may further be characterized in that said setting means are further adapted to set the logical value in a specified sixth bit position in said (n-1)-bit information word into a 'one' value if the number of trailing 'zeroes' exceeds said specified second number. This enables a decoder to identify whether the number of trailing 'zeroes' in the original information word exceeded the specified second number, or not. If so, it can reverse the binary value in the specified fourth bit position of the channel word received into a 'zero' bit value.

The encoding arrangement is further characterized in that if the logical value in said fifth bit position is set to 'one' by the setting means and the logical value in said sixth bit position is set to 'zero' by the setting means, the setting means are further adapted to reposition the logical values originally present in said fifth and sixth bit positions to seventh and eighth bit positions in said information word, said seventh and eighth bit positions lying within said specified third number of leading bit positions, said seventh and eighth bit positions not coinciding with said third bit position, and in that if the logical value in said fifth bit position is set to 'zero' and the logical value in said sixth bit position is set to 'one' by the setting means, the setting means are further adapted to reposition the logical values originally present in said fifth and sixth bit positions to ninth and tenth bit positions in said information word, said ninth and tenth bit positions lying within said specified fourth number of trailing bit positions, said ninth and tenth bit positions not coinciding with said fourth bit position. This enables the original bit values of the fifth and the sixth bit positions to be retained. If the number of trailing 'zeroes' exceeds the specified second number, those original values are stored instead of two 'zeroes' in two bit positions (the ninth and tenth bit position) within the specified second number of trailing bit positions. Upon reception in the decoding arrangement, the decoding arrangement can establish the fact that the number of trailing 'zeroes' exceeded the specified second number by detecting the 'zero' value in the fifth bit position and the 'one' value in the sixth bit position. The decoding arrangement can now replace the logical value in the ninth and tenth bit position into the fifth and sixth bit position and set the logical values in the ninth and tenth bit position to 'zero' in order to recreate the original information word. It will be clear that an equivalent process is carried out in the case that the logical values of the fifth and sixth bit position were stored in the seventh and eighth bit position.

The same argumentation is valid, of course, in the case that a group of more than k consecutive bit positions at the leading or the trailing side of the first and the second bit positions in the information word would otherwise violate the k-constraint.

These and other aspects of the invention will be apparent from and elucidated with reference to the embodiments described hereafter.

FIG. 1 shows a first embodiment of the encoding arrangement,

FIG. 2 shows a first embodiment of a decoding arrangement for decoding the channel words obtained with the encoding arrangement of FIG. 1, FIG. 3 shows a second embodiment of the encoding arrangement, FIG. 4 shows an embodiment of a part of the encoding arrangement of FIG. 3, FIG. 5 shows a second embodiment of a decoding arrangement for decoding the channel words obtained with the encoding arrangement of FIG. 3, FIG. 6 shows a third embodiment of the encoding arrangement, FIG. 7 shows a third embodiment of the decoding arrangement for decoding channel words obtained with the encoding arrangement of FIG. 6, FIG. 8 shows a further embodiment of the encoding arrangement and FIG. 9 shows an embodiment of the decoding arrangement for decoding channel words obtained with the encoding arrangement of FIG. 8.

DETAILED DESCRIPTION OF THE PREFERRED EMBODIMENTS

Figure 1:
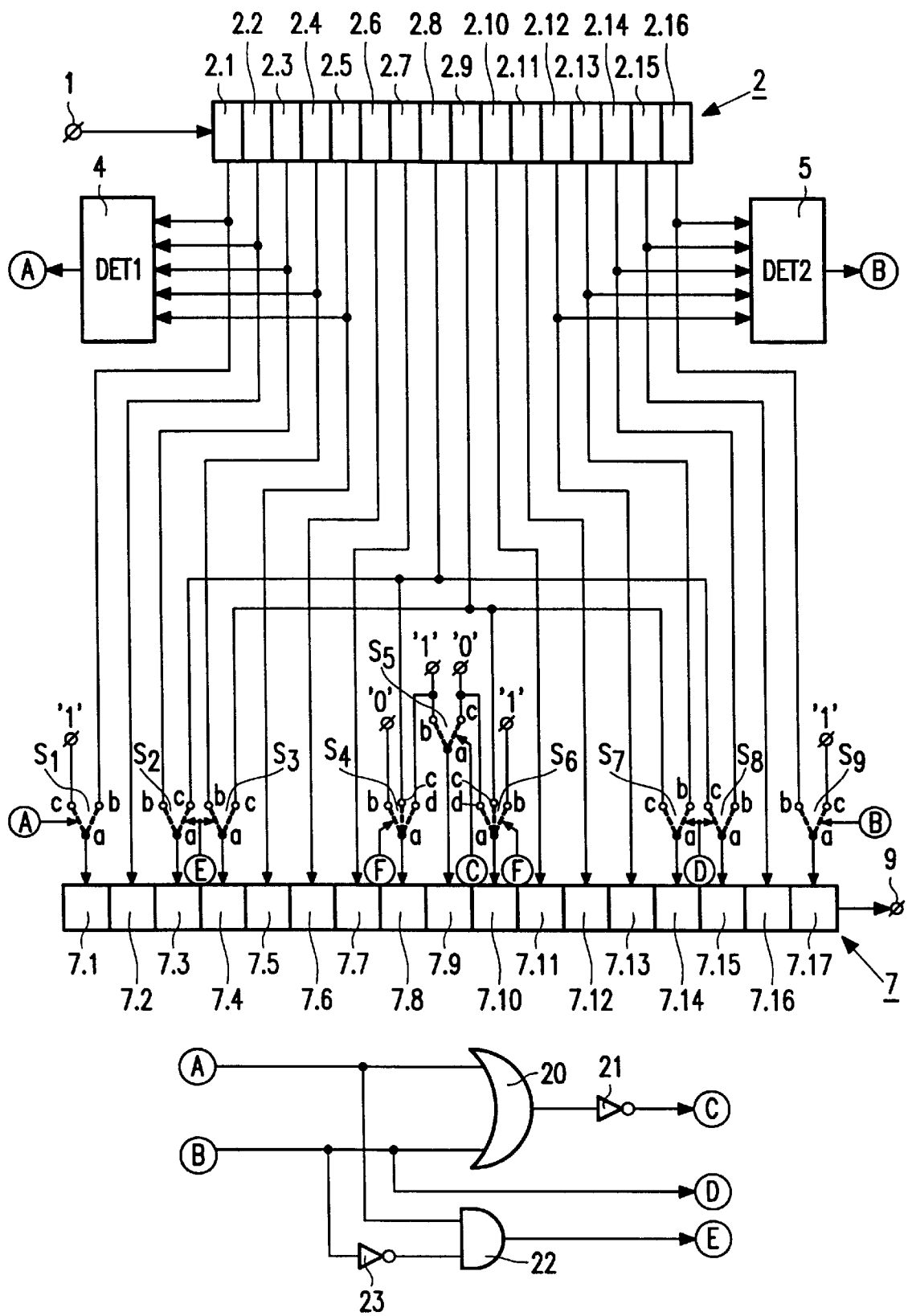

FIG. 1 shows a schematic embodiment of the encoding arrangement. The encoding arrangement described is capable of encoding 16-bit information words into 17-bit channel words, with the requirement that at most 8 consecutive 'zeroes' are present in the sequence of subsequent channel words (k=8). The encoding arrangement has an input terminal 1 for receiving the information words. The input terminal 1 is coupled to an input of a shift register 2. The shift register 2 has in this example 16 storage locations 2.1 to 2.16. The shift register 2 has 16 parallel outputs, one for each of the 16 storage locations. A further shift register 7 is available having 17 storage locations 7.1 to 7.17. An output of the shift register 7 is coupled to an output terminal 9 for supplying the 17-bit channel words. The shift register 7 has 17 parallel inputs, one for each of the 17 storage locations. A detector 4 is present having inputs coupled to the outputs of the storage locations 2.1 to 2.5 (those storage locations comprise the bit values of the five leading bit positions of the information word). A detector 5 is present having inputs coupled to the outputs of the storage locations 2.12 to 2.16 (those storage locations comprise the bit values of the five trailing bit positions of the information word).

The detector 4 detects whether there are more than 4 consecutive leading 'zeroes' in the information word stored in the register 2. Leading 'zeroes' are defined as being the 'zeroes' preceding the first 'one' in the information word. As soon as the detector 4 has detected five 'zeroes' at its five inputs, it will generate a control signal A, having a 'one' or 'high' logic value. Otherwise, the control signal A will be 'zero' or 'low'. The detector 5 detects whether there are more than 4 consecutive trailing 'zeroes' in the information word stored in the register 2. Trailing 'zeroes' are defined as being the 'zeroes' succeeding the last 'one' in the information word. As soon as the detector 5 has detected five 'zeroes' at its five inputs, it will generate a control signal B, having a 'one' or 'high' logic value. Otherwise, the control signal B is 'low' or 'zero'.

The output of the storage location 2.1 is coupled to a terminal 'b' of a switch $S_1$. The output of the storage location 2.2 is coupled to the input of the storage location 7.2 of the shift register 7. The output of the storage location 2.3 is coupled to a terminal 'b' of a switch $S_2$. The output of the storage location 2.4 is coupled to a terminal 'b' of a switch $S_3$. The outputs of the storage locations 2.5, 2.6 and 2.7 are coupled to inputs of respective storage locations 7.5, 7.6 and 7.7 of the shift register 7.

The output of the storage register 7.8 is coupled to a terminal 'c' of the switch $S_2$, to a terminal 'c' of a switch $S_4$ and to a terminal 'c' of a switch $S_8$. The output of the storage register 7.9 is coupled to a terminal 'c' of the switch $S_3$, to a terminal 'c' of a switch $S_6$ and to a terminal 'c' of a switch $S_7$. The outputs of the storage locations 2.10, 2.11 and 2.12 are coupled to inputs of respective storage locations 7.11, 7.12 and 7.13 of the shift register 7. The output of the storage location 2.13 is coupled to a terminal 'b' of the switch $S_7$. The output of the storage location 2.14 is coupled to a terminal 'b' of the switch $S_8$. The output of the storage location 2.15 is coupled to the input of the storage location 7.16 of the shift register 7. The output of the storage location 2.16 is coupled to a terminal 'b' of a switch $S_9$.

Terminals 'c' of the switches $S_1$ and $S_9$ are coupled to a logical 'high' or 'one' value. 'a' terminals of the switches $S_1$ and $S_9$ are coupled to inputs of the storage locations 7.1 and 7.17 respectively. 'a' terminals of the switches $S_2$ and $S_3$ are coupled to inputs of the storage locations 7.3 and 7.4 respectively. 'a' terminals of the switches $S_7$ and $S_8$ are coupled to inputs of the storage locations 7.14 and 7.15 respectively.

A 'b' terminal of the switch $S_4$ is coupled to a binary 'low' or 'zero' value. A 'd' terminal of the switch $S_4$ is coupled to a binary 'high' or 'one' value. An 'a' terminal of the switch $S_4$ is coupled to an input of the storage location 7.8. A 'b' terminal of the switch $S_6$ is coupled to a binary 'high' or 'one' value. A 'd' terminal of the switch $S_6$ is coupled to a binary 'low' or 'zero' value. An 'a' terminal of the switch $S_6$ is coupled to an input of the storage location 7.10. Further, a switch $S_5$ is present having an 'a' terminal coupled to the input of the storage location 7.9, a 'b' terminal coupled to a binary 'high' or 'one' value and a 'c' terminal coupled to a binary 'low' or 'zero' value.

The switches are all controllable switches, in that their switch position can be controlled in response to a control signal applied to the switches. The switch position of the switch $S_1$ is controlled in response to the control signal A, generated by the detector 4, such that, if the control signal A is 'high', the switch $S_1$ is in its position a-c, so that the '1' value is supplied to the input of the storage location 7.1. The switch $S_1$ is in the position a-b otherwise. The switch position of the switch $S_9$ is controlled in response to the control signal B, generated by the detector 5, such that, if the control signal B is 'high', the switch $S_9$ is in its position a-c, so that the '1' value is supplied to the input of the storage location 7.17. The switch $S_9$ is in the position a-b otherwise.

The switch position of the switch $S_5$ is controlled in response to a control signal C. This control signal is derived from the control signals A and B using an OR-gate 20 and the inverter 21, as can be seen in FIG. 1. If either the control signal A, or the control signal B, or if both control signals A and B are 'high', the control signal C is 'low'. As a result, the switch $S_5$ is in its position a-c, so that a '0' value is supplied to the input of the storage location 7.9. The switch $S_5$ is in the position a-b otherwise, so that a '1' value is supplied to the storage location 7.9.

The switch positions of the switches $S_2$ and $S_3$ are controlled in response to a control signal E. This control signal is derived from the control signals A and B using an AND-gate 22 and the inverter 23, as can be seen in FIG. 1. Only if the control signal A is 'high' and the control signal B is 'low', the control signal E is 'high'. As a result, the switches $S_2$ and $S_3$ are switched into their positions a-c, so that the outputs of the storage locations 2.8 and 2.9 of the shift register 2 are coupled to the inputs of the storage locations 7.3 and 7.4 respectively of the shift register 7. The switches $S_2$ and $S_3$ are in their positions a-b otherwise, so that the outputs of the storage locations 2.3 and 2.4 of the shift register 2 are coupled to the inputs of the storage locations 7.3 and 7.4 respectively of the shift register 7.

The switch positions of the switches $S_7$ and $S_8$ are controlled in response to a control signal D. This control signal is derived from the control signal B, as can be seen in FIG. 1. If the control signal B is 'high', the control signal D is 'high'. As a result, the switches $S_7$ and $S_8$, are switched into their positions a-c, so that the outputs of the storage locations 2.8 and 2.9 of the shift register 2 are coupled to the inputs of the storage locations 7.15 and 7.14 respectively of the shift register 7. The switches $S_7$ and $S_8$, are in their positions a-b otherwise, so that the outputs of the storage locations 2.13 and 2.14 of the shift register 2 are coupled to the inputs of the storage locations 7.14 and 7.15 respectively of the shift register 7.

The switches $S_4$ and $S_6$ are controlled by a control signal F. This control signal F controls the switches into one of its three switch positions. The control signal F can also be derived from the control signals A and B, as follows. If both A and B are 'low', the control signal F is such that the switches $S_4$ and $S_6$ are in their positions a-c. That means that the outputs of the storage locations 2.8 and 2.9 of the shift register 2 are coupled to the inputs of the storage locations 7.8 and 7.10 respectively of the shift register 7. If A is 'high' and B is 'low', the control signal F is such that the switches $S_4$ and $S_6$ are in their positions a-d. That means that the input of the storage location 7.8 is coupled to the logic '1' terminal and the input of the storage location 7.10 is coupled to the logic '0' terminal. If A is 'low' and B is 'high', the control signal F is such that the switches $S_4$ and $S_6$ are in their positions –b. That means that the input of the storage location 7.8 is coupled to the logic '0' terminal and the input of the storage location 7.10 is coupled to the logic '1' terminal. If both A and B are 'high', the control signal F is such that the switch $S_4$ is in its position a-d and $S_6$ is in its position a-b. That means that the inputs of both storage locations 7.8 and 7.10 are coupled to the logic '1' terminal.

The storage location 7.9, the switch $S_5$, the OR gate 20 and the inverter 21 can be considered to be included in the claimed inserting means. The switches $S_1$ to $S_4$ and $S_6$ to $S_9$ can, together with the circuitry required for obtaining the control signals A, B, D, E and F, be considered as being included in the claimed setting means.

The functioning of the arrangement will be explained hereafter. Assuming that an information word stored in the shift register 2 has less than 5 consecutive leading 'zeroes' and less than 5 consecutive trailing 'zeroes'. Thus, the control signals A and B are both 'low'. Consequently, the switches $S_1$ and $S_9$ are in their position a-b. Further, the control signal C is 'high', so that the switch $S_5$ is in its position a-b. Moreover, the control signals D and E are both 'low' resulting in the switches $S_2$, $S_3$, $S_7$ and $S_8$ being in their positions a-b. The control signal F will be such that the switches $S_4$ and $S_6$ are in their positions a-c. As a result, the contents of the shift register 2 is stored in the storage locations 7.1 to 7.8 and 7.10 to 7.17 unaltered. Further, '1' bit is stored in the location 7.9. The channel word now stored in the shift register 7 can be supplied to the output 9 by serially outputting the contents of the shift register 7.

By inserting the '1' bit in the storage location 7.9, the channel word supplied to the output 9 will satisfy the k constraint of having 8 consecutive 'zeroes' at the maximum. Further, as the number of leading and trailing 'zeroes' is 4 at the maximum, also a concatenation of this channel word with a preceding or a subsequent channel word will satisfy the k-constraint.

Assuming now that an information word is stored in the shift register 2 that has 5 or more consecutive leading 'zeroes' and less than 5 consecutive trailing 'zeroes'. Suppose that the previous channel word had exactly 4 trailing 'zeroes'. A concatenation of the information word stored in the register 2 with the previous channel word would now lead to a violation of the k-constraint, if no precautions are taken. As a result of the five or more leading 'zeroes', the control signal A is 'high' and B is 'low'. Consequently, the switch $S_1$ is in its position a-c and the switch $S_9$ is in its position a-b. Further, the control signal C is 'low', so that the switch $S_5$ is in its position a-c. Moreover, the control signal D is 'low' and the control signal E is 'high' resulting in the switches $S_2$ and $S_3$ being switched into their position a-c, and the switches $S_7$ and $S_8$ remaining in their positions a-b. The control signal F will be such that the switches $S_4$ and $S_6$ are switched into their positions a-d. As a result, a '1' bit is stored in the storage location 7.1 of the shift register 7, the contents of the storage location 2.2 is stored in the storage location 7.2, the contents of the storage locations 2.8 and 2.9 are stored in the storage locations 7.3 and 7.4 respectively, the contents of the storage locations 2.5, 2.6 and 2.7 are stored in the storage locations 7.5, 7.6 and 7.7 respectively, a '1' bit is stored in the storage location 7.8, '0' bits are stored in the storage locations 7.9 and 7.10, and the contents of the storage locations 2.10 to 2.16 of the shift register 2 is stored in the storage locations 7.11 to 7.17 unaltered.

By setting the bit value in the storage location 7.1 to '1', the possible violation of the k-constraint has been avoided. Further, the bit value in the storage location 7.9 is '0', indicating that either the leading or the trailing end of the information word comprised 5 or more consecutive (leading or trailing) 'zeroes'. The '1' bit stored in the storage location 7.8 is an indication that the information word had 5 or more leading 'zeroes'. The contents of the storage locations 2.8 and 2.9 that were normally stored in the storage locations 7.8 and 7.10 respectively, need now be stored elsewhere, as the bits stored in the storage locations 7.8 to 7.10 are now used for signalling. The two bit values of the storage locations 2.8 and 2.9 are now stored in the storage locations 7.3 and 7.4 respectively. From the signalling bits stored in the storage locations 7.8 to 7.10, it is known that the information word comprised more than four leading 'zeroes'. The contents of one of two storage locations 2.8 and 2.9 can not be stored in the first storage location 7.1 as the '1' bit stored there is required to avoid a violation of the k-constraint. The contents of the two storage locations 2.8 and 2.9 can thus be stored in two of the four storage locations 7.2 to 7.5 of the register 7 (in the present situation the locations 7.3 and 7.4) of which it is sure that those storage locations must comprise a 'zero' value upon decoding.

Assuming now that an information word is stored in the shift register 2 that has 5 or more consecutive trailing 'zeroes' and less than 5 consecutive leading 'zeroes'. Suppose that the next channel word had exactly 4 leading 'zeroes'. A concatenation of the information word stored in the register 2 with the next channel word would now lead to a violation of the k-constraint, if no precautions are taken. As a result of the five or more trailing 'zeroes', the control signal A is 'low' and B is 'high'. Consequently, the switch $S_1$ is in its position a-b and the switch $S_9$ is in its position a-c. Further, the control signal C is 'low', so that the switch $S_5$ is in its position a-c. Moreover, the control signal D is 'high' and the control signal E is 'low' resulting in the switches $S_2$ and $S_3$ being switched into their position a-b, and the switches $S_7$ and $S_8$ being switched into their positions a-c. The control signal F will be such that the switches $S_4$ and $S_6$ are switched into their positions a-b. As a result, the contents of the storage locations 2.1 to 2.7 are stored in the storage positions 7.1 to 7.7 respectively of the register 7. A '0' bit is stored in the storage locations 7.8 and 7.9 of the shift register 7. The contents of the storage locations 2.8 and 2.9 are stored in the storage locations 7.15 and 7.14 respectively, the contents of the storage locations 2.10, 2.11 and 2.12 are stored in the storage locations 7.11, 7.12 and 7.13 respectively and a '1' bit is stored in the storage location 7.17.

By setting the bit value in the storage location 7.17 to '1', the possible violation of the k-constraint has been avoided. Further, the bit value in the storage location 7.9 is again '0', indicating that either the leading or the trailing end of the information word comprised 5 or more consecutive (leading or trailing) 'zeroes'. The '1' bit stored in the storage location 7.10 is an indication that the information word had 5 or more trailing 'zeroes'. The contents of the storage locations 2.8 and 2.9 that were normally stored in the storage locations 7.8 and 7.10 respectively, need now be stored elsewhere, as the bits stored in the storage locations 7.8 to 7.10 are again used for signalling. The two bit values of the storage locations 2.8 and 2.9 are now stored in the storage locations 7.15 and 7.14 respectively. From the signalling bits stored in the storage locations 7.8 to 7.10, it is known that the information word comprised more than four trailing 'zeroes'. The contents of one of two storage locations 2.8 and 2.9 can not be stored in the last storage location 7.17 as the '1' bit stored there is required to avoid a violation of the k-constraint. The contents of the two storage locations 2.8 and 2.9 can thus be stored in two of the four storage locations 7.13 to 7.16 of the register 7 (in the present situation the locations 7.14 and 7.15) of which it is sure that those storage locations must comprise a 'zero' value upon decoding.

Assuming now that an information word is stored in the shift register 2 that has 5 or more consecutive leading 'zeroes' and 5 or more consecutive trailing 'zeroes'. Again, this could lead to a violation of the k-constraint, if no precautions are taken. As a result of the five or more leading and trailing 'zeroes', the control signals A and B are both 'high'. Consequently, the switches $S_1$ and $S_9$ are both in their position a-c. Further, the control signal C is 'low', so that the switch $S_5$ is in its position a-c. Moreover, the control signal D is 'high' and the control signal E is 'low' resulting in the switches $S_2$ and $S_3$ being switched into their position a-b, and the switches $S_7$ and $S_8$ being switched into their positions a-c. The control signal F will be such that the switch $S_4$ is switched into its position a-d and the switch $S_6$ is switched into its position a-b. As a result, a '1' bit is stored in the storage location 7.1, the contents of the storage location 2.2 is stored in the storage location 7.2, the contents of the storage locations 2.5 to 2.7 are stored in the storage positions 7.5 to 7.7 respectively of the register 7. A '1' bit is stored in the storage locations 7.8 and 7.10 of the shift register 7. A '0' bit is stored in the storage location 7.9. The contents of the storage locations 2.8 and 2.9 are stored in the storage locations 7.15 and 7.14 respectively, the contents of the storage locations 2.10, 2.11 and 2.12 are stored in the storage locations 7.11, 7.12 and 7.13 respectively and a '1' bit is stored in the storage location 7.17.

By setting the bit values in the storage locations 7.1 and 7.17 to '1', the possible violation of the k-constraint has been avoided. Further, the bit value in the storage location 7.9 is again '0', indicating that either the leading or the trailing end of the information word comprised 5 or more consecutive (leading or trailing) 'zeroes'. The '1' bits stored in the storage locations 7.8 and 7.10 are an indication that the information word had 5 or more leading and 5 or more trailing 'zeroes'. The contents of the storage locations 2.8 and 2.9 that were normally stored in the storage locations 7.8 and 7.10 respectively, need now be stored elsewhere, as the bits stored in the storage locations 7.8 to 7.10 are again used for signalling. The two bit values of the storage locations 2.8 and 2.9 are now stored in the storage locations 7.15 and 7.14 respectively. From the signalling bits stored in the storage locations 7.8 to 7.10, it is known that the information word comprised more than four trailing 'zeroes'. The contents of one of two storage locations 2.8 and 2.9 can not be stored in the last storage location 7.17 as the '1' bit stored there is required to avoid a violation of the k-constraint. The contents of the two storage locations 2.8 and 2.9 can thus be stored in two of the four storage locations 7.13 to 7.16 of the register 7 (in the present situation the locations 7.14 and 7.15) of which it is sure that those storage locations must comprise a 'zero' value upon decoding.

It should be noted that the bit values of the storage locations could have been stored in e.g. two of the four storage locations 7.2 to 7.5 or that one bit value of e.g. the storage location 2.8 could have been stored in one of the storage locations 7.2 to 7.5 and the other bit of the storage location 2.9 could have been stored in one of the storage locations 7.13 to 7.16.

Figure 2:
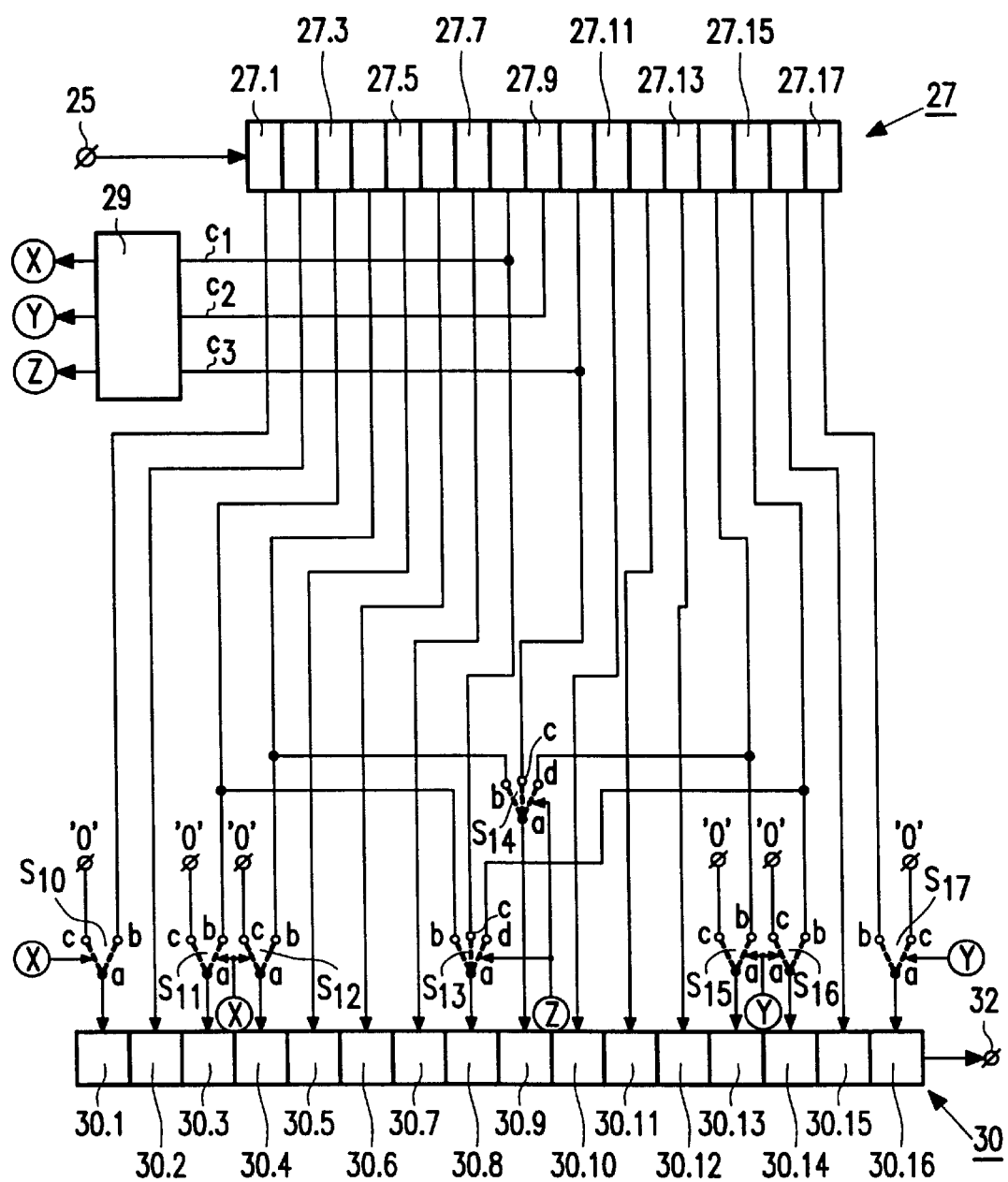

FIG. 2 shows a schematic embodiment of the decoding arrangement. The decoding arrangement described is capable of decoding 17-bit channel words obtained with the encoding arrangement of FIG. 1 into 16-bit information words. The decoding arrangement has an input terminal 25 for receiving the channel words. The input terminal 25 is coupled to an input of a shift register 27. The shift register 27 has in this example 17 storage locations 27.1 to 27.17. The shift register 27 has 17 parallel outputs, one for each of the 17 storage locations. A further shift register 30 is available having 16 storage locations 30.1 to 30.16. An output of the shift register 30 is coupled to an output terminal 32 for supplying the 16-bit information words. The shift register 30 has 16 parallel inputs, one for each of the 16 storage locations. A detector 29 is present having inputs coupled to the outputs of the storage locations 27.8 to 27.10. Those storage locations may comprise the signalling bits (c1, c2, c3).

The detector 29 detects the bit values of the storage locations 27.8 to 27.10 of a channel word received and generates control signals X, Y and Z in response to the bit values (c1, c2, c3), as will be explained later.

The output of the storage location 27.1 is coupled to a terminal 'b' of a switch $S_{10}$. The output of the storage location 27.2 is coupled to the input of the storage location 30.2 of the shift register 30. The output of the storage location 27.3 is coupled to a terminal 'b' of a switch $S_{11}$, and to a terminal 'b' of a switch $S_{13}$. The output of the storage location 27.4 is coupled to a terminal 'b' of a switch $S_{12}$ and to a terminal 'b' of a switch $S_{14}$. The outputs of the storage locations 27.5, 27.6 and 27.7 are coupled to inputs of respective storage locations 30.5, 30.6 and 30.7 of the shift register 30.

The output of the storage location 27.8 is coupled to a terminal 'c' of the switch $S_{13}$. The output of the storage location 27.10 is coupled to a terminal 'c' of the switch $S_{14}$. The outputs of the storage locations 27.11, 27.12 and 27.13 are coupled to inputs of respective storage locations 30.10, 30.11 and 30.12 of the shift register 30. The output of the storage location 27.14 is coupled to a terminal 'b' of a switch $S_{15}$ and to the terminal 'd' of the switch $S_{14}$. The output of the storage location 27.15 is coupled to a terminal 'b' of a switch $S_{16}$ and to the terminal 'd' of the switch $S_{13}$. The output of the storage location 2.16 is coupled to the input of the storage location 30.15 of the shift register 30. The output of the storage location 27.17 is coupled to a terminal 'b' of a switch $S_{17}$.

Terminals 'c' of the switches $S_{10}$ to $S_{12}$ and $S_{15}$ to $S_{17}$ are coupled to a logical 'low' or 'zero' value. 'a' terminals of the switches $S_{10}$ and $S_{17}$ are coupled to inputs of the storage locations 30.1 and 30.16 respectively. 'a' terminals of the switches $S_{11}$ and $S_{12}$ are coupled to inputs of the storage locations 30.3 and 30.4 respectively. 'a' terminals of the switches $S_{13}$ and $S_{14}$ are coupled to inputs of the storage locations 30.8 and 30.9 respectively. 'a' terminals of the switches $S_{15}$ and $S_{16}$ is coupled to an input of the storage locations 30.13 and 30.14 respectively.

The switches are all controllable switches, in that their switch position can be controlled in response to a control signal applied to the switches. The switch position of the switches $S_{10}$ to $S_{12}$ is controlled in response to a control signal X, generated by the detector 29. The switch position of the switches $S_{13}$ and $S_{14}$ is controlled in response to a control signal Z, generated by the detector 29. The switch position of the switches $S_{15}$ to $S_{17}$ is controlled in response to a control signal Y, generated by the detector 29.

The control signals X, Y and Z are derived from the signalling bits (c1, c2, c3) in the following way. If the signalling bit c2 is '1', the control signals X and Y are both 'high', so that the switches $S_{10}$ to $S_{12}$ and $S_{15}$ to $S_{17}$ are all in their position a-b. Further, the control signal Z is such that the switches $S_{13}$ and $S_{14}$ are both in their position a-c. As a result, the contents of the bit positions 27.1 to 27.7 and 27.8 to 27.17 is stored in the storage locations of the register 30 unaltered. The 16-bit information word now stored in the register 30 can be supplied to the output 32 as a reconverted information word. This information word was an information word, as originally encoded, that had less than 5 leading 'zeroes' and less than 5 trailing 'zeroes'.

If the signalling bits (c1, c2, c3) have the bit pattern (1, 0, 0), the control signal X 'low' and the control signal Y remains 'high'. As a result, the switches $S_{10}$ to $S_{12}$ are now switched into their switch positions a-c. Further, the control signal Z is now such that the switches $S_{13}$ and $S_{14}$ are both in their positions a-b.

If the signalling bits (c1,c2,c3) have the bit pattern (0,0,1), the control signal X now becomes 'high' and the control signal Y now becomes 'low'. As a result, the switches $S_{10}$ to $S_{12}$ are now switched into their switch positions a-b and the switches $S_{15}$ to $S_{17}$ are switched into their positions a-c. Further, the control signal Z is now such that the switches $S_{13}$ and $S_{14}$ are both in their positions a-d.

If the signalling bits (c1, c2, c3) have the bit pattern (1, 0, 1), both control signals X and Y are 'low'. As a result, the switches $S_{10}$ to $S_{12}$ and the switches $S_{15}$ to $S_{17}$ are now in their switch positions a-c Further, the control signal Z is now such that the switches $S_{13}$ and $S_{14}$ are again both in their positions a-d. The generation of the control signals X and Y can be obtained using the OR gates 35 and 36 and the inverters 37 and 38 shown in FIG. 2.

The switches $S_{10}$ to $S_{17}$ can, together with the circuitry required for the generation of the control signals for controlling the switch positions of those switches, be considered as the claimed setting means. Further, the storage location 27.9 can be considered to be the claimed deletion means.

The functioning of the decoding arrangement will be explained hereafter. Assuming that an information word that was originally encoded had less than 5 consecutive leading 'zeroes' and less than 5 consecutive trailing 'zeroes'. This situation has already be discussed above. The signalling bit c2 is '1', and the contents of the bit positions 27.1 to 27.7 and 27.8 to 27.17 is stored in the storage locations of the register 30 unaltered. The bit values in the storage locations 27.8 and 27.10 are no signalling bits, but the bits in the bit position 8 and 9 respectively of the original information word.

Assuming now that an information word that was originally encoded had 5 or more consecutive leading 'zeroes' and less than 5 consecutive trailing 'zeroes'. The signalling bits now have the pattern (1, 0, 0). As explained above, the control signal X is 'low' and the control signal Y is 'high'. The switches $S_{10}$ to $S_{12}$ are switched into their switch position a-c and the switches $S_{13}$ and $S_{14}$ are switched into their position a-b. The switches $S_{15}$ to $S_{17}$ remain in their position a-b. As a result, a '0' bit is stored in each of the storage locations 30.1, 30.3 and 30.4 of the shift register 30 and the contents of the storage locations 27.3 and 27.4 are stored in the storage locations 30.8 and 30.9 respectively. This results in the reconstruction of the original information word.

Assuming now that an information word that was originally encoded had 5 or more consecutive trailing 'zeroes' and less than 5 consecutive leading 'zeroes'. The signalling bits now have the pattern (0, 0, 1). As explained above, the control signal X is 'high' and the control signal Y is 'low'. The switches $S_{10}$ to $S_{12}$ are switched into their switch position a-b and the switches $S_{13}$ and $S_{14}$ are switched into their position a-d. The switches $S_{15}$ to $S_{17}$ are switched into their position a-c. As a result, a '0' bit is stored in each of the storage locations 30.13, 30.14 and 30.16 of the shift register 30 and the contents of the storage locations 27.15 and 27.14 are stored in the storage locations 30.8 and 30.9 respectively. This results in the reconstruction of the original information word.

Assuming now that an information word that was originally encoded had 5 or more consecutive leading 'zeroes' and 5 or more consecutive trailing 'zeroes'. The signalling bits now have the pattern (1, 0, 1). As explained above, the control signals X and Y are both 'low'. The switches $S_{10}$ to $S_{12}$ are switched into their switch position a-c and the switches $S_{13}$ and $S_{14}$ are switched into their position a-d. The switches $S_{15}$ to $S_{17}$ are switched into their position a-c. As a result, a '0' bit is stored in each of the storage locations 30.1, 30.3, 30.4, 30.13, 30.14 and 30.16 of the shift register 30 and the contents of the storage locations 27.15 and 27.14 are stored in the storage locations 30.8 and 30.9 respectively. This results in the reconstruction of the original information word.

Various modifications of the encoding and decoding arrangements of the FIGS. 1 and 2 respectively are possible. In the embodiment of FIG. 1, the added bit (which is the signalling bit c2 of FIG. 2) was inserted in between the bit positions with sequence number 8 and 9 of the information word: that is, exactly in the middle of the information word, as the information word has an even number of bits. This had the advantage that, when adding a '1' bit in this position, the information word including the added '1' bit already satisfied the k-constraint for k=8. If, however, the k value would have been higher, e.g. 9, it would have been possible to insert the added bit in between the bit positions with sequence numbers 7 and 8, or 9 and 10. In such a situation, where k is e.g. 9, the '1' bits, now stored in the storage locations 7.1 and 7.17 could have been stored in the storage locations 7.2 and 7.16. Further, in a more general situation, the detector 4 detects the bit values in the first p storage locations in the shift register 2 and the detector 5 detects the bit values stored in the last q storage locations in the shift register 2. The numbers p-1 and q-1, being the specified first and second numbers respectively claimed in the claims, have a relationship with k. More specifically, this relationship can be that k equals the sum of p-1 and q-1. So, in the embodiment described above, one could have decided to detect whether more than 3 leading 'zeroes' are present and whether more than 5 trailing 'zeroes' are present in the information word.

The signalling bits c1 and c3 indicating, in a situation when the bit stored in the storage location 7.9 has a '0' value, whether the number of leading or trailing 'zeroes' exceeded p-1 and q-1 respectively, may be stored in other storage locations than the storage locations 7.8 and 7.10, such as the storage locations 7.6, 7.7, 7.11 and 7.12. The information word may have an odd number of bits.

Figure 3:
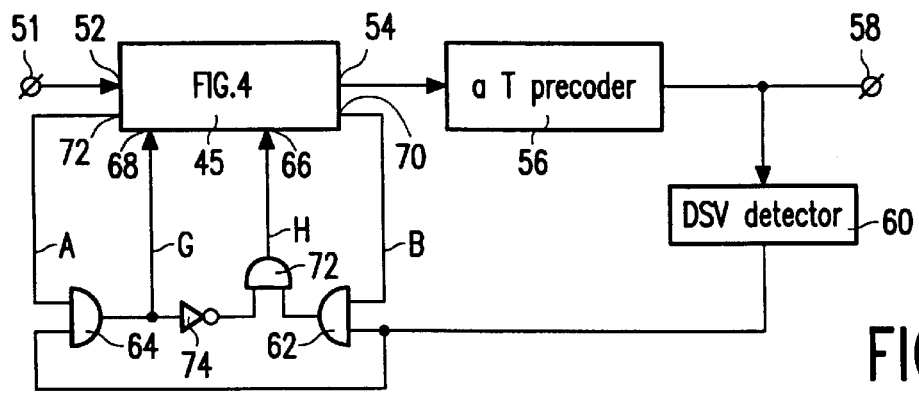

FIG. 3 shows schematically a second embodiment of the encoding arrangement in accordance with the invention. The arrangement of FIG. 3 has a unit indicated by the reference numeral 45, having an input 52 coupled to the input terminal 51, an output 54 which is coupled to an input of an aT precoder, well known in the art, where a is an integer that can have the value 1 or 2. An output of the aT precoder 56 is coupled to an output terminal 58 and to an input of a DSV detector 60. An output of the DSV detector 60 is coupled to first inputs of AND gates 62 and 64. Outputs of the AND gates 62 and 64 are coupled to inputs 66 and 68 respectively of the unit 45. Further outputs 70 and 72 of the unit 45 are coupled to second inputs of the AND gates 62 and 64 respectively.

Figure 4:
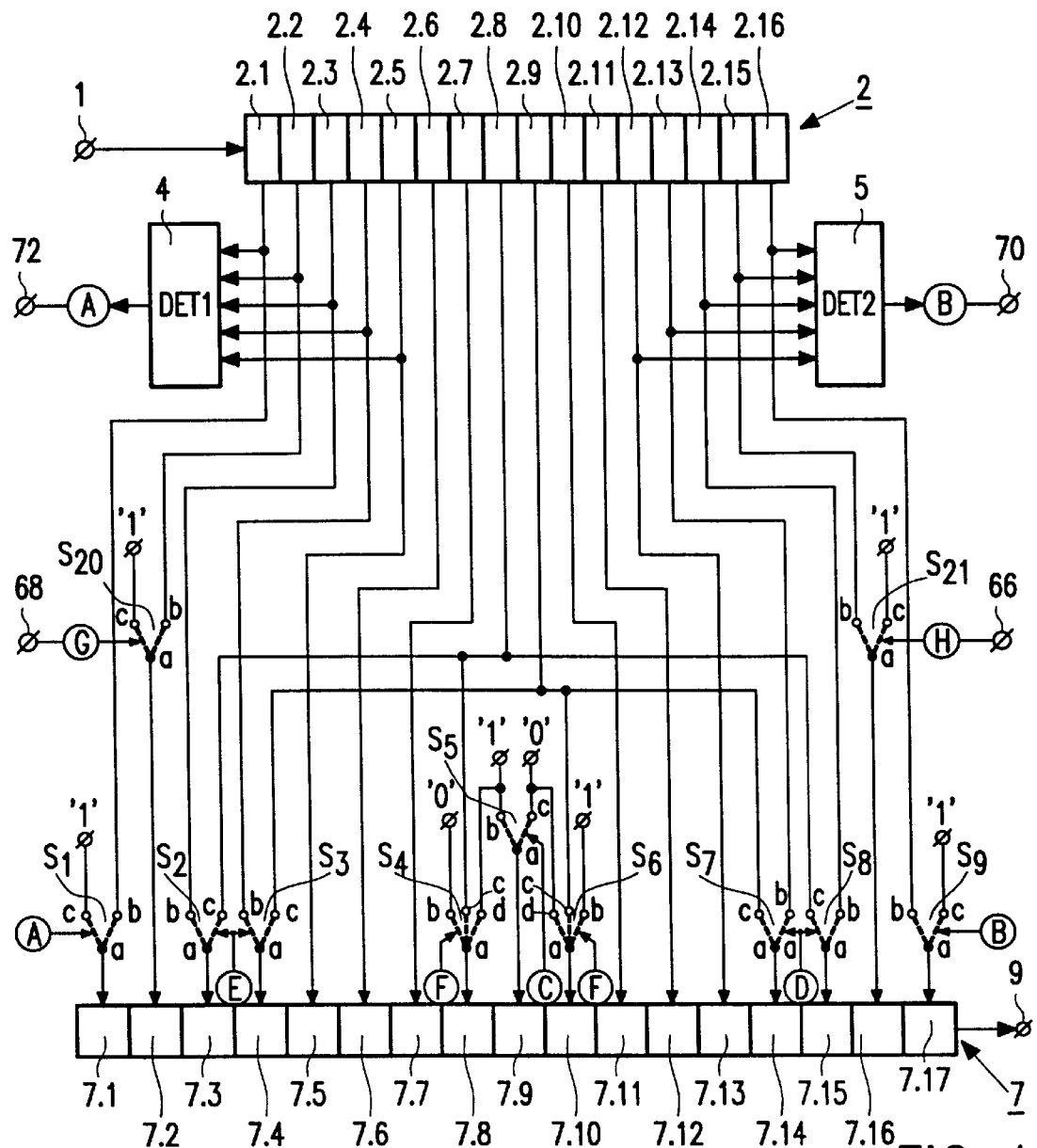

An embodiment of the unit 45 is further disclosed in FIG. 4. The unit 45 of FIG. 4 shows much resemblance with the embodiment of FIG. 1, with the only difference that additional switches $S_{20}$ and $S_{21}$, are present. 'a' terminals of the switches $S_{20}$ and $S_{21}$, are coupled to the inputs of the storage locations 7.2 and 7.10 respectively. 'b' terminals of the switches $S_{20}$ and $S_{21}$, are coupled to the outputs of the storage locations 2.2 and 2.15 respectively. 'c' terminals of the switches $S_{20}$ and $S_{21}$ are coupled to a terminal of binary 'high' value '1'. The switch positions of the switches $S_{20}$ and $S_{21}$, can be controlled by means of control signals G and H respectively. The control signals G and H are derived from the control signals A and B and from the control signal generated by the DSV detector 60, using the AND gates 62, 64 and 72 and the inverter 74.

The embodiment of the FIGS. 3 and 4 is based on the recognition that, in the case that the information word comprises more than p-1 leading 'zeroes' and/or more than q-1 trailing 'zeroes', some of those leading/trailing 'zeroes' can be used for controlling the DSV (digital sum value) of the output signal of the aT precoder 56. To that purpose, the detector 60 detects the running digital sum of the output signal of the output signal of the at precoder 56 and generates a control signal such that said output signal is, as an example DC free.

In the present embodiment, a DC free output signal at the output terminal 58 can be obtained by controlling the position of at least one of the switches $S_{20}$ and $S_{21}$ when either the control signal A or the control signal B, or both are 'high'. This can be realized as follows.

Assuming that an information word stored in the shift register 2 has less than 5 consecutive leading 'zeroes' and less than 5 consecutive trailing 'zeroes'. Thus, the control signals A and B are both 'low'. Consequently, the AND gates 62 and 64 are both locked, so that both the control signals G and H are 'low'. As a result of this, the switches $S_{20}$ and $S_{21}$, are in their position a-b, and the contents of the shift register 2 is stored in the storage locations 7.1 to 7.8 and 7.10 to 7.17 unaltered, as explained previously.

Assuming now that an information word is stored in the shift register 2 that has 5 or more consecutive leading 'zeroes' and less than 5 consecutive trailing 'zeroes'. As a result of the five or more leading 'zeroes', the control signal A is 'high' and B is 'low'. Consequently, the AND gate 62 is blocked, but the AND gate 64 can supply the control signal from the detector 60 to the input 68. First, the detector 60 generates a 'low' control signal at its output, so that a 'low' control signal G is supplied to the switch $S_{20}$. As a result of this both switches $S_{20}$ and $S_{21}$ are in their positions a-b. The contents of the storage location 2.2, which is a '0' bit is supplied to the storage location 7.2 and stored therein. The channel word thus obtained (called the first channel word) is supplied to the aT precoder and the precoded (first) channel word is supplied to the detector 60, so that the detector 60 can establish the change in the DSV caused by this precoded (first) channel word. Next, the detector 60 generates a 'high' control signal at its output so that the control signal G now becomes 'high'. As a result of this, the switch $S_{20}$ is switched into its position a-c, so that a '1' bit is stored in the storage location 7.2, resulting in another channel word (called the second channel word), obtained from the same information word stored in the register 2. The (second) channel word thus obtained is supplied to the aT precoder 56 and the precoded (second) channel word is supplied to the detector 60, so that the detector 60 can establish the change in the DSV caused by this precoded (second) channel word. The detector 60 now decides which one of the two precoded channel words results in the best approximation of a DC free output signal. The (first or second) channel word that realizes the best match is chosen as the output channel word.

Assuming now that an information word is stored in the shift register 2 that has 5 or more consecutive trailing 'zeroes' and less than 5 consecutive leading 'zeroes'. As a result of the five or more trailing 'zeroes', the control signal A is 'low' and B is 'high'. Consequently, the AND gate 64 is blocked but the AND gate 62 can supply the control signal from the detector 60 to the input 66, as the AND gate 72 is also 'open'. First, the detector 60 generates a 'low' control signal at its output, so that a 'low' control signal H is supplied to the switch $S_{21}$. As a result of this both switches $S_{20}$ and $S_{21}$ are in their positions a-b. The contents of the storage location 2.15, which is a '0' bit is supplied to the storage location 7.16 and stored therein. The channel word thus obtained (called the first channel word) is supplied to the aT precoder and the precoded (first) channel word is supplied to the detector 60, so that the detector 60 can establish the change in the DSV caused by this precoded (first) channel word. Next, the detector 60 generates a 'high' control signal at its output so that the control signal H now becomes 'high'. As a result of this, the switch $S_{21}$ is switched into its position a-c, so that a '1' bit is stored in the storage location 7.16, resulting in another channel word (called the second channel word), obtained from the same information word stored in the register 2. The (second) channel word thus obtained is supplied to the aT precoder 56 and the precoded (second) channel word is supplied to the detector 60, so that the detector 60 can establish the change in the DSV caused by this precoded (second) channel word. The detector 60 now decides which one of the two precoded channel words results in the best approximation of a DC free output signal. The (first or second) channel word that realizes the best match is chosen as the output channel word.

Assuming now that an information word is stored in the shift register 2 that has 5 or more consecutive leading 'zeroes' and 5 or more consecutive trailing 'zeroes'. As a result, both control signals A and B are 'high'. Consequently, both AND gates 62 and 64 are 'open'. However, the gate 72 is now blocked, so that the control signal from the detector 60 can only be supplied to the input 68. First, the detector 60 generates a 'low' control signal at its output, so that a 'low' control signal G is supplied to the switch $S_{20}$. As a result of this both switches $S_{20}$ and $S_{21}$ are in their positions a-b. The contents of the storage location 2.2, which is a '0' bit is supplied to the storage location 7.2 and stored therein. The channel word thus obtained (called the first channel word) is supplied to the aT precoder and the precoded (first) channel word is supplied to the detector 60, so that the detector 60 can establish the change in the DSV caused by this precoded (first) channel word. Next, the detector 60 generates a 'high' control signal at its output so that the control signal G now becomes 'high'. As a result of this, the switch $S_{20}$ is switched into its position a-c, so that a '1' bit is stored in the storage location 7.2, resulting in another channel word (called the second channel word), obtained from the same information word stored in the register 2. The (second) channel word thus obtained is supplied to the aT precoder 56 and the precoded (second) channel word is supplied to the detector 60, so that the detector 60 can establish the change in the DSV caused by this precoded (second) channel word. The detector 60 now decides which one of the two precoded channel words results in the best approximation of a DC free output signal. The (first or second) channel word that realizes the best match is chosen as the output channel word.

It should be noted that the switch $S_{20}$ could have been positioned in the signal line to the storage location 7.5 and that the switch $S_{21}$ could have been positioned in the signal line to the storage location 7.13. It is also possible to have switches in all of the signal lines to the storage locations 7.2, 7.5, 7.13 and 7.14. This gives the opportunity to choose between four possible channel words, namely obtained when both switches in the signal lines to the storage locations 7.2 and 7.5 are in their position a-b, or both switches are in their position a-c, or when the switch $S_{20}$ is in its position a-b and the other switch is in its position a-c, or when the switch $S_{20}$ is in its position a-c and the other switch is in its position a-b.

Figure 5:
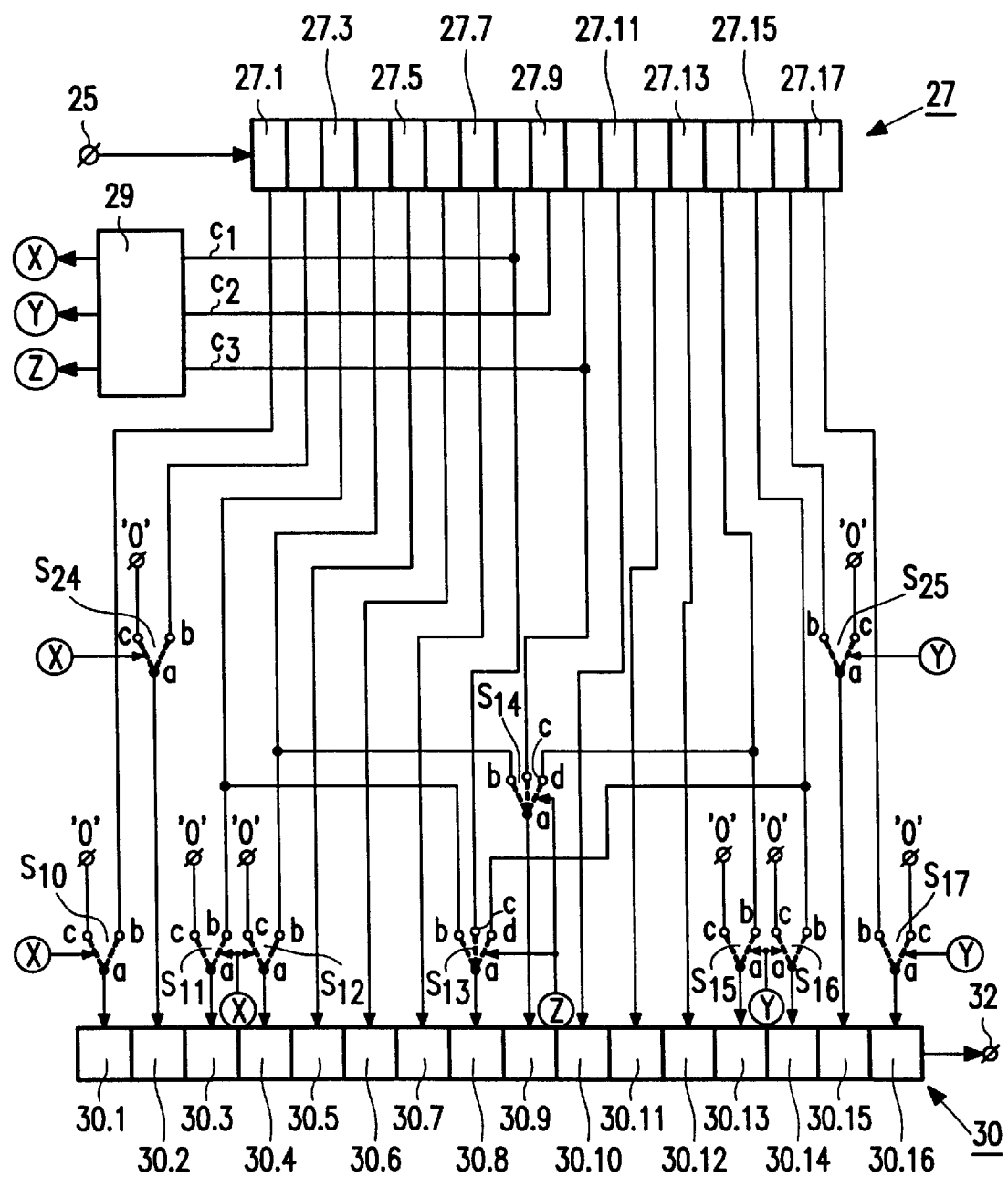

FIG. 5 shows an embodiment of a decoding arrangement for decoding the channel words obtained with the encoding arrangement of the FIG. 3 and 4. It should be noted here that, when recording the precoded channel words obtained with the encoding arrangement of FIG. 3 onto a magnetic record carrier, a subsequent reproduction from this record carrier leads to the channel words that were present prior to precoding. The decoding arrangement therefore shows much resemblance with the decoding arrangement of FIG. 2, with the difference that two additional switches $S_{24}$ and $S_{25}$ are present in the signal lines to the storage locations 30.2 and 30.15. 'a' terminals of the switches $S_{24}$ and $S_{25}$ are coupled to the inputs of the storage locations 30.2 and 30.15 respectively. 'b' terminals of the switches $S_{24}$ and $S_{25}$ are coupled to the outputs of the storage locations 27.2 and 27.16 respectively. 'c' terminals of the switches $S_{24}$ and $S_{25}$ are coupled to a terminal of binary 'low' value '0'. The switch positions of the switches $S_{24}$ and $S_{25}$ can be controlled by means of the control signals X and Y respectively.

As a result, if the signalling bit c2, stored in the storage location 27.9 is '1', both switches $S_{24}$ and $S_{25}$ are in their position a-b, so that the contents of the storage positions 27.2 and 27.16 can be transferred to the storage locations 30.2 and 30.15. If the signalling bits (c1, c2, c3) are (1, 0, 0), the switch $S_{24}$ is switched into its position a-c, so that a '0' bit can be stored in the storage location 30.2, irrespective of the contents in the storage location 27.2. If the signalling bits (c1, c2, c3) are (0, 0, 1), the switch $S_{25}$ is switched into its position a-c, so that a '0' bit can be stored in the storage location 30.15, irrespective of the contents in the storage location 27.16. If the signalling bits (c1, c2, c3) are (1, 0, 1), the switches $S_{24}$ and $S_{25}$ are both switched into their position a-c, so that a '0' bit can be stored in the storage locations 30.2 and 30.15, irrespective of the contents in the storage locations 27.2 and 27.16.

It will be clear that when, upon reception so as to carry out a decoding of the channel words, the signalling bit c2 in a channel word received is uncorrect, the (n-1)-bit information word obtained after decoding of said channel word will be uncorrect. In the embodiment of the encoding arrangement of FIG. 6 and the decoding arrangement of FIG. 7, measures have been taken to at least minimize the influence of the reception of an uncorrect signalling bit c2.

Figure 6:
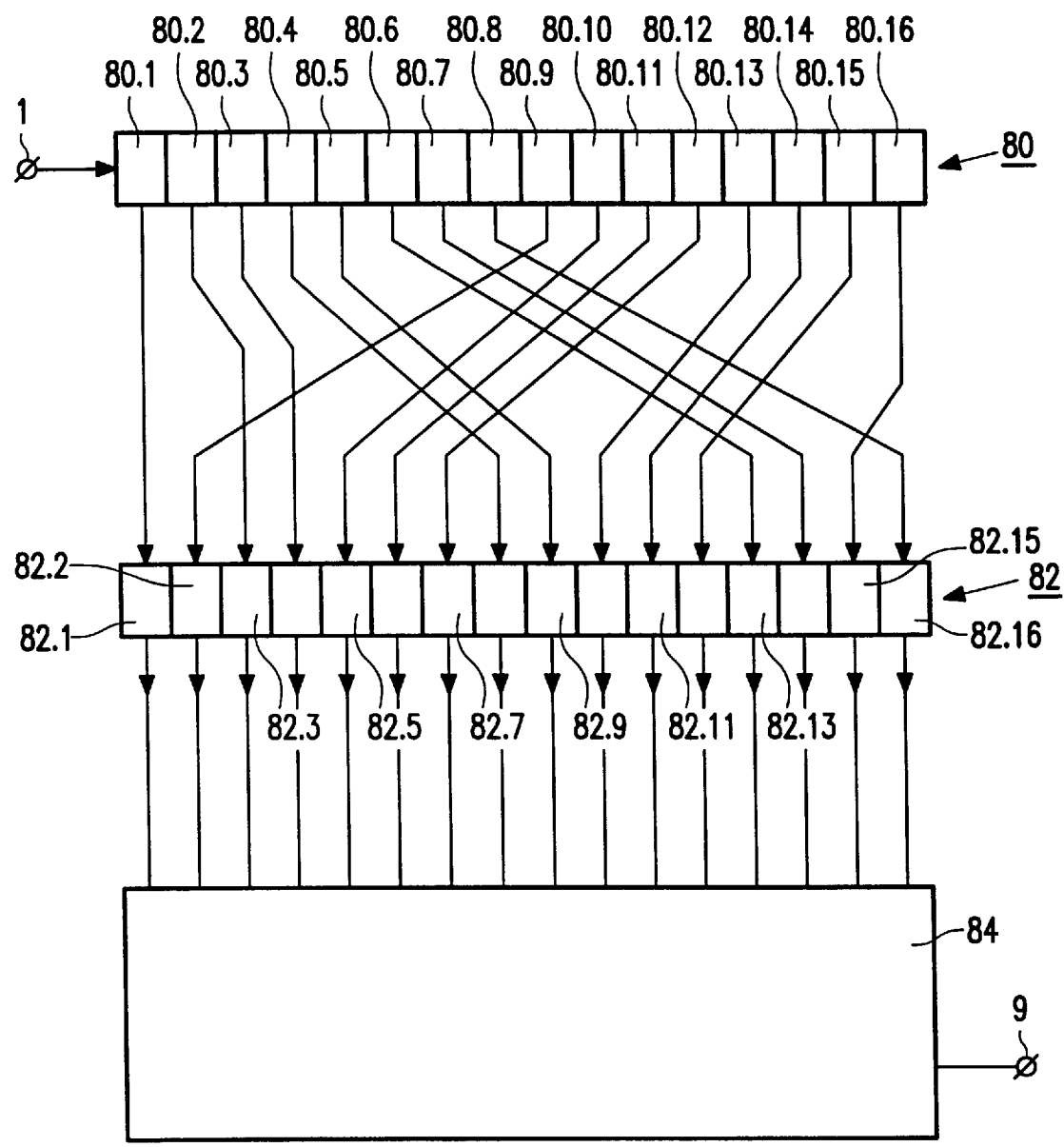

The embodiment of FIG. 6 shows in more detail only the input part of the encoding arrangement. The input terminal 1 of the encoding arrangement is now coupled to an input of an intermediate shift register 80, having storage locations 80.1 to 80.16. The intermediate shift register 80 has 16 parallel outputs, one for each of the 16 storage locations. Outputs of this shift register 80 are coupled to corresponding inputs of a memory 82, having storage locations 82.1 to 82.16. The memory 82 of FIG. 6 can be considered to be equivalent to shift register 2 of the embodiment of FIG. 1, in the sense that the 16 outputs of the 16 storage locations of the memory 82 are the same as the 16 outputs of the shift register 2 of FIG. 1. It should thus be understood that the detectors 4 and 5, the shift register 7 and the switches $S_1$ to $S_9$ are present in the block denoted 84 so as to make the embodiment of the encoding arrangement of FIG. 6 complete.

In the embodiment of FIG. 6, bytes of 8-bit words are supplied to the input terminal 1, where two subsequent bytes (called byte 1 and byte 2) can be stored in the shift register 80, such that byte 1 is stored in the storage locations 80.1 to 80.8 and the byte 2 is stored in the storage locations 80.9 to 80.16.

The output of the storage location 80.1 is coupled to the input of the storage location 82.1. The outputs of the storage locations 80.2 and 80.3 are coupled to a respective input of the storage locations 82.3 and 82.4 respectively. The outputs of the storage locations 80.4 and 80.5 are coupled to a respective input of the storage locations 82.8 and 82.9 respectively. The outputs of the storage locations 80.6 and 80.7 are coupled to a respective input of the storage locations 82.13 and 82.14 respectively. The output of storage location 80.8 is coupled to the input of storage location 82.16. As a consequence, the byte 1 stored in the storage locations 80.1 to 80.8 is stored in those storage locations in the memory 82, that may be affected upon encoding.

The output of the storage location 80.9 is coupled to the input of the storage location 82.2. The outputs of the storage locations 80.10, 80.11 and 80.12 are coupled to a respective input of the storage locations 82.5, 82.6 and 82.7 respectively. The outputs of the storage locations 80.13, 80.14 and 80.153 are coupled to a respective input of the storage locations 82.10, 82.11 and 82.12 respectively. The output of storage location 80.16 is coupled to the input of storage location 82.15. As a consequence, the byte 2 stored in the storage locations 80.9 to 80.16 is stored in those storage locations in the memory 82, that are not affected upon encoding.

Figure 7:
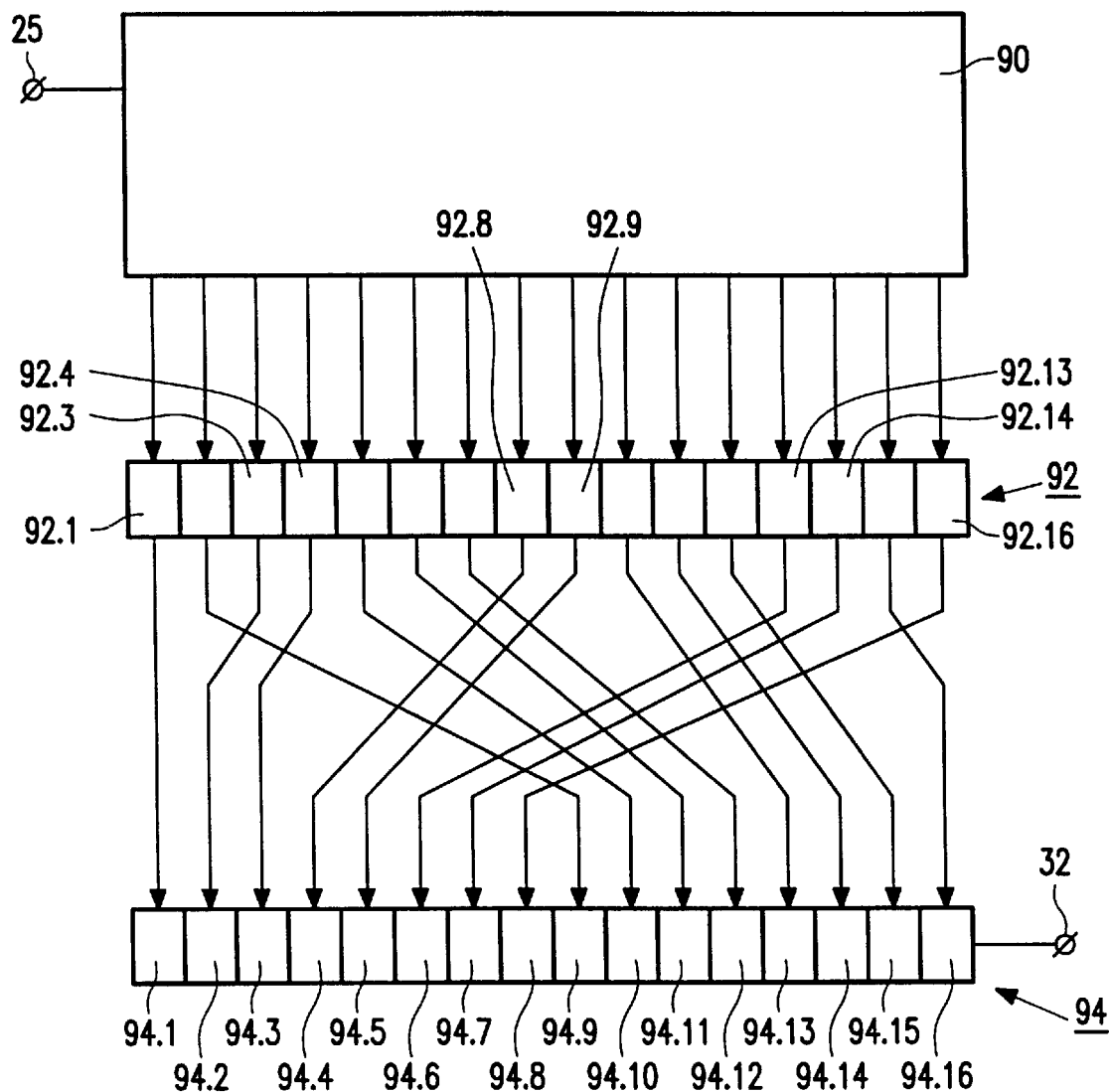

The embodiment of the corresponding decoding arrangement shown in FIG. 7 shows in more detail only the output part of the decoding arrangement. The input terminal 25 of the decoding arrangement is coupled to an input of a block denoted by the reference numeral 90. This block comprises the shift register 27, the detector 29 and the switches $S_{10}$ to $S_{17}$ of FIG. 2. Further, an intermediate shift register 94, having storage locations 94.1 to 94.16 is present. The intermediate shift register 94 has 16 parallel inputs, one for each of the 16 storage locations and one output coupled to the output terminal 32 of the decoding arrangement. The inputs of this shift register 94 are coupled to corresponding outputs of a memory 92, having storage locations 92.1 to 92.16. The memory 92 of FIG. 7 can be considered to be equivalent to shift register 30 of the embodiment of FIG. 2, in the sense that the 16 inputs of the 16 storage locations of the memory 92 are the same as the 16 inputs of the shift register 30 of FIG. 2.

The output of the storage location 92.1 is coupled to the input of the storage location 94.1. The outputs of the storage locations 92.3 and 92.4 are coupled to a respective input of the storage locations 94.2 and 92.3 respectively. The outputs of the storage locations 92.8 and 92.9 are coupled to a respective input of the storage locations 94.4 and 94.5 respectively. The outputs of the storage locations 92.13 and 92.14 are coupled to a respective input of the storage locations 94.6 and 94.7 respectively. The output of storage location 92.16 is coupled to the input of storage location 94.8. As a consequence, the byte 1 that was originally stored in the storage locations 80.1 to 80.8 of the register 80 in FIG. 6 is now stored in the storage locations 94.1 to 94.8 of the register 94.

It will further be appreciated that the inputs of the storage locations 94.9 to 94.16 are coupled to the outputs of those storage locations of the memory 92 that the byte 2 will be stored in the storage locations 94.9 to 94.16.

Suppose that the signalling bit c2 has been changed because of errors occurring during reception. As a result, the switches $S_{10}$ to $S_{17}$ in FIG. 2 will be in the wrong position, leading to possibly erroneous values in the storage locations 92.1, 92.3, 92.4, 92.8, 92.9, 92.13, 92.14, and 92.16 of the memory 92 of FIG. 7. Thus, the byte 1 stored in the storage locations 94.1 to 94.8 is wrong and the byte 2 stored in the storage locations 94.9 to 94.16 is still correct. As a consequence, an incorrect signalling bit c2 can only affect one of the two bytes comprised in the information word.

Figure 8:
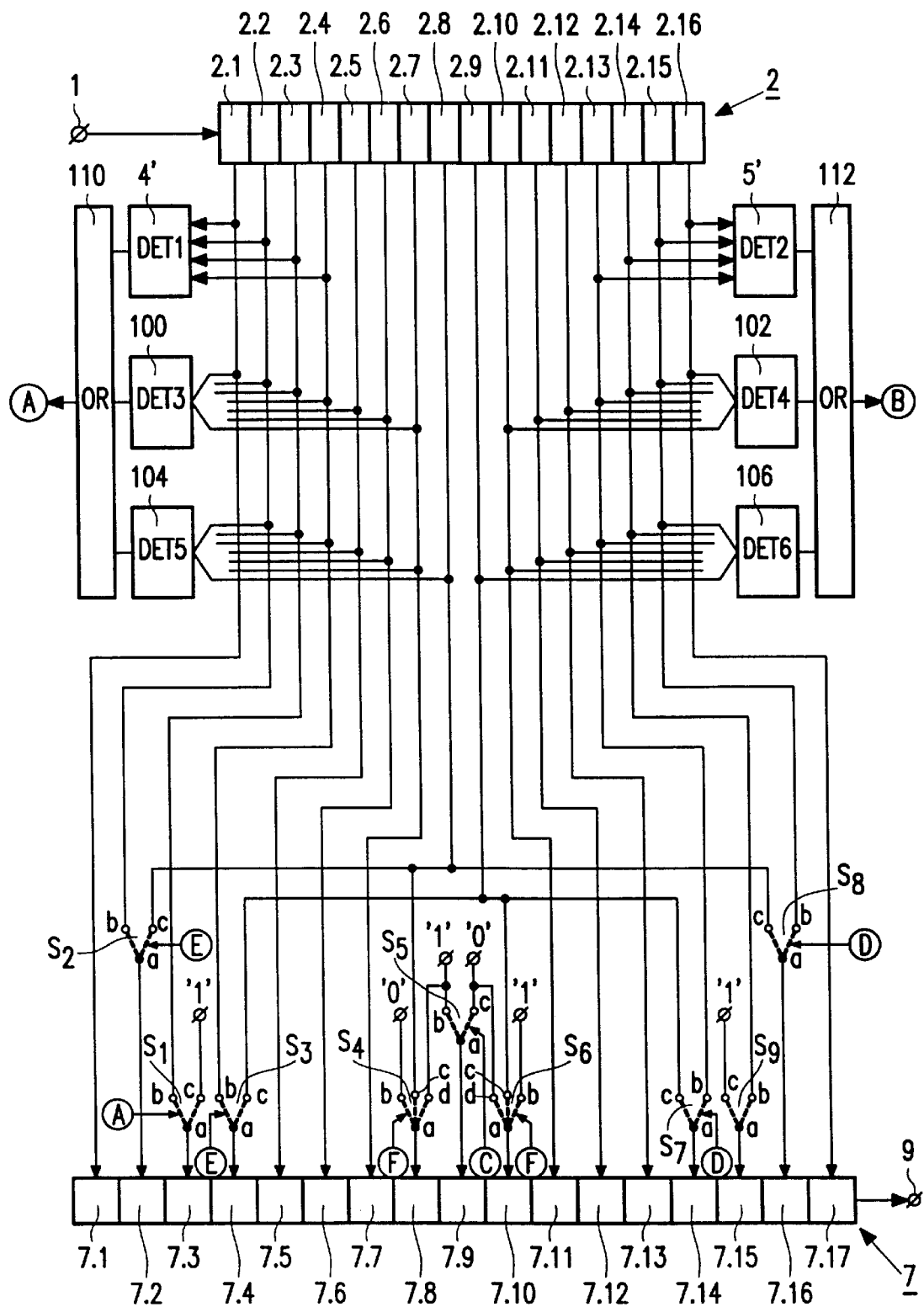

A further embodiment of an encoding arrangement is shown in FIG. 8. This arrangement is adapted to encode (n-1)=16-bit information words into (n)=17-bit channel words, the sequence of subsequent channel words satisfying a k-constraint for k smaller than (n-1)/2, that is in the specific embodiment of FIG. 8: k=6. The embodiment of FIG. 8 shows large resemblances with the embodiment of FIG. 1. The fact that k equals 6 means that, even after inserting a '1'-bit in between the bit positions 8 and 9 of the information word, it may be possible that the k-constraint is violated in the first half or the second half of the 17-bit channel word obtained. Therefore, it is necessary to further detect whether a sequence of at least 7 consecutive 'zeroes' are present in the first half or the second half of the information word. To that purpose, the embodiment of FIG. 8 further comprises detectors 100 and 104 so as to detect whether seven consecutive 'zeroes' are stored in the seven storage locations 2.1 to 2.7 or 2.2 to 2.8 respectively, and detectors 102 and 106 so as to detect whether seven consecutive 'zeroes' are stored in the seven storage locations 2.10 to 2.16 or 2.9 to 2.16 respectively. Further, the detectors 4 and 5 of the embodiment of FIG. 1 have been slightly adapted in the sense that they need to detect whether four consecutive leading or trailing 'zeroes' respectively are present in the information word. Outputs of the detectors 4', 100 and 104 are coupled to respective inputs of an OR-gate 110, an output of which supplies the control signal A. Outputs of the detectors 5', 102 and 106 are coupled to respective inputs of an OR-gate 112, an output of which supplies the control signal B.

Further, the switch $S_1$, originally inserted in the connection between the output of the storage location 2.1 and the input of the storage location 7.1, is now inserted in the connection between the output of the storage location 2.3 and the input of the storage location 7.3. The switch $S_9$, originally inserted in the connection between the output of the storage location 2.16 and the input of the storage location 7.17, is now inserted in the connection between the output of the storage location 2.14 and the input of the storage location 7.15. The switch $S_2$, originally inserted in the connection between the output of the storage location 2.3 and the input of the storage location 7.3, is now inserted in the connection between the output of the storage location 2.2 and the input of the storage location 7.2. The switch $S_8$, originally inserted in the connection between the output of the storage location 2.14 and the input of the storage location 7.15, is now inserted in the connection between the output of the storage location 2.15 and the input of the storage location 7.17.

The generation of the control signals C, D, E and F can be the same as in the embodiment of FIG. 1. Further, the response of the switches as regards their switch positions, in response to the control signals supplied thereto, is the same as explained with reference to FIG. 1.

A 'high' control signal A is an indication of the occurrence of four 'zeroes' in the storage locations 2.1 to 2.4, or seven 'zeroes' in the storage locations 2.1 to 2.7, or seven 'zeroes' in the storage locations 2.2 to 2.8. In response thereto, a '1' bit is stored in the storage location 7.3 so as to avoid the violation of the k-constraint. Further, a '1'-bit is stored in the storage location 7.8, a '1'-bit is stored in the storage locations 7.9 and 7.10 (assuming the control signal B is 'low'), the bit values stored in the storage locations 2.8 and 2.9 are now stored in the storage locations 7.2 and 7.4 respectively.

A 'high' control signal B is an indication of the occurrence of four 'zeroes' in the storage locations 2.13 to 2.16, or seven 'zeroes' in the storage locations 2.10 to 2.16, or seven 'zeroes' in the storage locations 2.9 to 2.15. In response thereto, a '1' bit is stored in the storage location 7.15 so as to avoid the violation of the k-constraint. Further, a '1'-bit is stored in the storage location 7.10, a '0'-bit is stored in the storage locations 7.8 and 7.9 (assuming the control signal A is 'low'), the bit values stored in the storage locations 2.8 and 2.9 are now stored in the storage locations 7.16 and 7.14 respectively.

'High' control signals A and B are an indication of the occurrence of four 'zeroes' in the storage locations 2.1 to 2.4, or seven 'zeroes' in the storage locations 2.1 to 2.7, or seven 'zeroes' in the storage locations 2.2 to 2.8, and an indication of the occurrence of four 'zeroes' in the storage locations 2.13 to 2.16, or seven 'zeroes' in the storage locations 2.10 to 2.16, or seven 'zeroes' in the storage locations 2.9 to 2.15. In response thereto, a '1' bit is stored in the storage locations 7.3 and 7.15 so as to avoid the violation of the k-constraint. Further, a '1'-bit is stored in the storage locations 7.8 and 7.10, a '0'-bit is stored in the storage location 7.9, and the bit values stored in the storage locations 2.8 and 2.9 are again stored in the storage locations 7.16 and 7.14 respectively.

Figure 9:
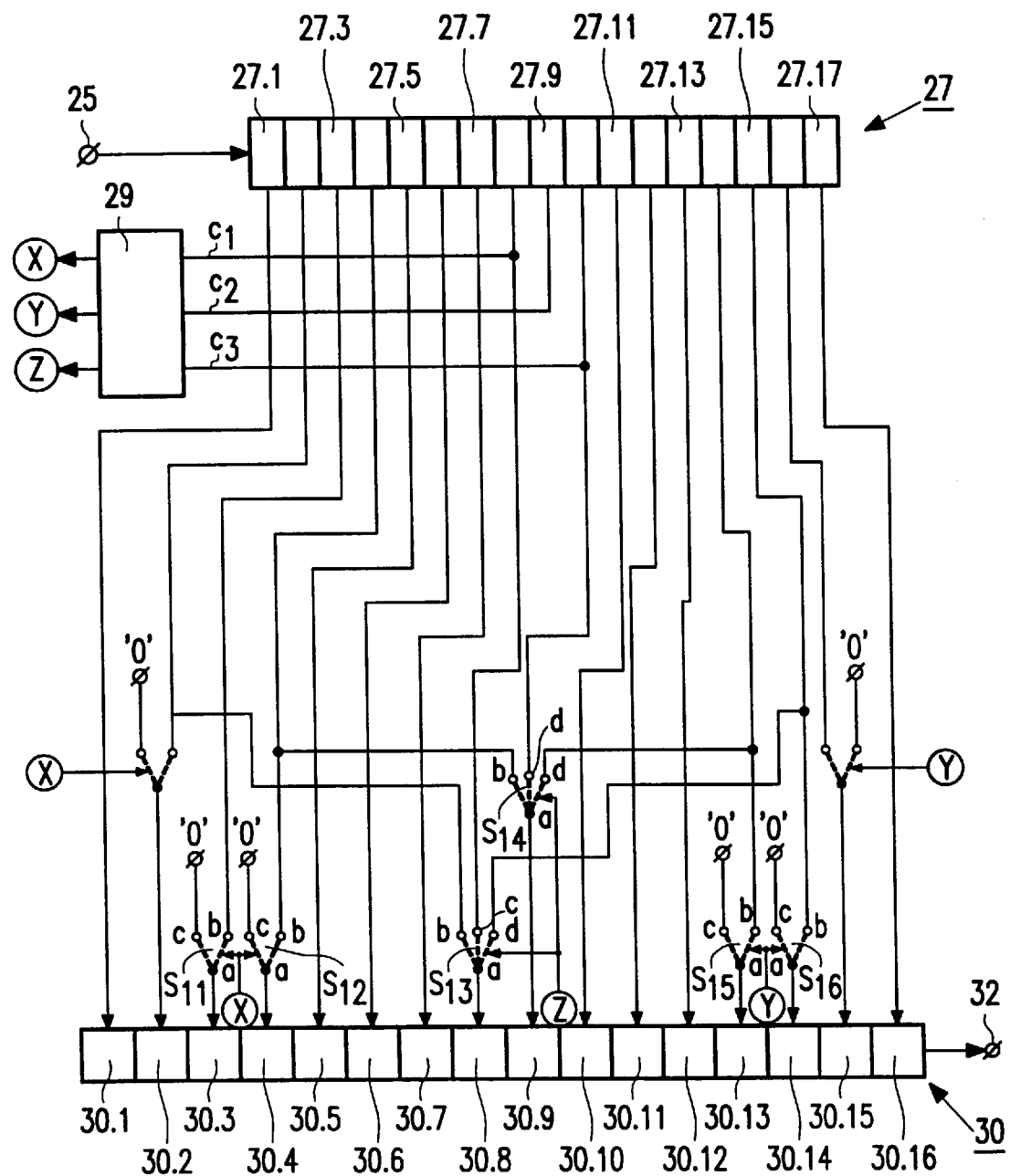

FIG. 9 shows an embodiment of a decoding arrangement for decoding the sequence of channel words supplied by the encoding arrangement of FIG. 8. The embodiment of FIG. 9 shows a large resemblance with the decoding arrangement of FIG. 2. The difference with the embodiment of FIG. 2 is that the switches $S_{10}$ and $S_{17}$ in FIG. 2 have been replaced so that they are inserted in the connections between the storage locations 27.2 to 30.2 and 27.16 and 30.15 respectively in FIG. 9. Further, the b-terminal of the switch $S_{13}$ is now coupled to the output of the storage location 27.2 and the d-terminal of this switch is coupled to the output of the storage location 27.15. The functioning of the embodiment of FIG. 9 is further fully identical to the functioning of the embodiment of FIG. 2, so that no further discussion is needed.

What is claimed is:

1. Encoding arrangement for encoding (n-1)-bit information words into n-bit channel words so as to obtain a channel signal of concatenated channel words, the channel signal being a bit sequence having the virtue that at most k 'zeros' between 'ones' occur, the encoding arrangement comprising:

input means for receiving the (n-1)-bit information words;
   converting means for converting the (n-1)-bit information words into n-bit channel words; and
   output means for supplying the channel signal of concatenated n-bit channel words, wherein the converting means comprises:
   inserting means for inserting one bit of a first or a second binary value in between a specified first and a second neighbouring bit position in each (n-1)-bit information word to form an n-bit channel word, a 'zero' bit being inserted in between said specified first and second neighbouring position of any particular (n-1)-bit information word if the number of leading 'zeros' at the leading end of said any particular information word exceeds a specified first integer number, or the number of trailing 'zeros' at the trailing end of said any particular information word exceeds a specified second integer number; and
   setting means for setting a logical value in a specified third bit position into a 'one' value if the number of leading 'zeros' exceeds said specified first number, and for setting a logical value in a specified fourth bit position into a 'one' value if the number of trailing 'zeros' exceeds said specified second number, the specified third bit position being one of a specified third number of leading bit positions of said any particular information word, the specified fourth bit position being one of a specified fourth number of trailing bit positions of said any particular information word, the specified third number being equal to the specified first number plus one, the specified fourth number being equal to the specified second number plus one, n and k being integer values and the specified first and second numbers having a relationship with k,
   the inserting means inserting a 'zero' bit in between said specified first and second neighbouring position if a group of more than k consecutive bit positions in the any particular information word comprise all 'zeros', said group of more than k consecutive bit positions not comprising both the specified first and second bit positions.

2. Encoding arrangement as claimed in claim 1, wherein the inserting means is further adapted to insert a 'one' bit in between said specified first and second neighbouring bit positions, otherwise.

3. Encoding arrangement as claimed in claim 1, wherein said group of more than k consecutive bit positions comprising all 'zeroes' occurs at the leading side of the first and second bit positions in the any particular information word, said third bit position further coinciding with one of said group of more than k consecutive bit positions comprising all 'zeroes'.

4. Encoding arrangement as claimed in claim 1, wherein said group of more than k consecutive bit positions comprising all 'zeroes' occurs at the trailing side of the first and second bit positions in the any particular information word, said fourth bit position further coinciding with one of said group of more than k consecutive bit positions comprising all 'zeroes'.

5. Encoding arrangement as claimed in claim 1, wherein said setting means is further adapted to set a logical value in a specified fifth bit position in said any particular information word into a 'one' value if the number of leading 'zeroes' exceeds said specified first number.

6. Encoding arrangement as claimed in claim 5, wherein said fifth bit position is not coinciding with any of the positions of the specified third number of leading bit positions or the specified fourth number of trailing bit positions of the any particular information word.

7. Encoding arrangement as claimed in claim 5, wherein said setting means is further adapted to set a logical value in a specified sixth bit position in said any particular information word into a 'one' value if the number of trailing 'zeroes' exceeds said specified second number.

8. Encoding arrangement as claimed in claim 7, wherein said sixth bit position is not coinciding with any of the positions of the specified third number of leading positions or the specified fourth number of trailing positions of the any particular information word.

9. Encoding arrangement as claimed in claim 7, wherein said sixth bit position is said second bit position.

10. Encoding arrangement as claimed in claim 7, wherein said setting means is further adapted to set the logical value in said specified fifth bit position in said any particular information word into a 'one' value if a group of more than k consecutive bit positions in the any particular information word comprising all 'zeroes' occurs at the leading side of the first and the second bit position in the any particular information word, the said group not comprising both the first and the second bit positions.

11. Encoding arrangement as claimed in claim 10, wherein said setting means is further adapted to set the logical value in said specified sixth bit position in said any particular information word into a 'one' value if a group of more than k consecutive bit positions in the any particular information word comprising all 'zeroes' occurs at the trailing side of the first and the second bit position in the any particular information word, the said group not comprising both the first and the second bit positions.

12. Encoding arrangement as claimed in claim 11, wherein said setting means is adapted to set the logical value in said specified sixth bit position to 'zero', otherwise.

13. Encoding arrangement as claimed in claim 12, wherein if the logical value in said fifth bit position is set to 'one' by the setting means and the logical value in said sixth bit position is set to 'zero' by the setting means, the setting means is further adapted to reposition logical values originally present in said fifth and sixth bit positions to seventh and eighth bit positions in said any particular information word, said seventh and eighth bit positions lying within said specified third number of leading bit positions and lying within said group of more than k consecutive bit positions occurring at the leading side of the first and second bit positions, said seventh and eighth bit positions not coinciding with said third bit position.

14. Encoding arrangement as claimed in claim 12, wherein if the logical value in said fifth bit position is set to 'zero' and the logical value in said sixth bit position is set to 'one' by the setting means, the setting means is further adapted to reposition the logical values originally present in said fifth and sixth bit positions to ninth and tenth bit positions in said information word, said ninth and tenth bit positions lying within said specified fourth number of trailing bit positions and lying within said group of more than k consecutive bit positions occurring at the trailing side of said first and second bit positions, said ninth and tenth bit positions not coinciding with said fourth bit position.

15. Encoding arrangement as claimed in claim 10, wherein said setting means is adapted to set the logical value in said specified fifth bit position to 'zero', otherwise.

16. Encoding arrangement as claimed in claim 7, wherein if the logical value in said fifth bit position is set to 'one' by the setting means and the logical value in said sixth bit position is set to 'zero' by the setting means, the setting means is further adapted to reposition logical values originally present in said fifth and sixth bit positions to seventh and eighth bit positions in said any particular information word, said seventh and eighth bit positions lying within said specified third number of leading bit positions, said seventh and eighth bit positions not coinciding with said third bit position.

17. Encoding arrangement as claimed in claim 16, wherein if the logical value in said fifth bit position is set to 'zero' and the logical value in said sixth bit position is set to 'one' by the setting means, the setting means is further adapted to reposition the logical values originally present in said fifth and sixth bit positions to ninth and tenth bit positions in said any particular information word, said ninth and tenth bit positions lying within said specified fourth number of trailing bit positions, said ninth and tenth bit positions not coinciding with said fourth bit position.

18. Encoding arrangement as claimed in claim 5, wherein said fifth bit position is said first bit position.

19. Encoding arrangement as claimed in claim 1, wherein (n-1) is an even integer number and said first and second bit positions are the central bit positions in the any particular information word.

20. Encoding arrangement as claimed in claim 19, wherein the specified first number equals the specified second number and k=(n-1)/2.

21. Encoding arrangement as claimed in claim 1, wherein said third bit position is the leading bit position of the any particular information word, and said fourth bit position is the final bit position of the any particular information word.

22. Encoding arrangement as claimed in claim 1, wherein the specified first number equals the specified second number.

23. Encoding arrangement as claimed in claim 22, wherein (n-1) is an integer multiple of 4, and the specified first number equals (n-1)/4.

24. Encoding arrangement as claimed in claim 1, wherein k>{(n-1) div 2}/2.

25. Encoding arrangement as claimed in claim 1, wherein k>2 1 +entier(n/3), where entier(n/3) equals the smallest integer larger than or equal to n/3.

26. Encoding arrangement as claimed in claim 1, wherein k equals the sum of the first and the second specified numbers.

27. Encoding arrangement as claimed in claim 1, further comprising shuffling means for carrying out a shuffling step said any particular information on an information word prior to encoding.

28. Encoding arrangement as claimed in claim 27, wherein the shuffling step is such that bits stored in at least two neighbouring bit positions in the any particular information word are moved to at least two bit positions that may be affected by the setting means so as to obtain a shuffled information word.

29. Encoding arrangement as claimed in claim 1, further comprising digital sum value determining means for generating a control signal in response to a digital sum value of said channel signal, the setting means being further adapted to set a logical value in at least one further specified bit position into a 'one' value in response to said control signal, the at least one further specified bit position being one of the specified third number of leading bit positions of the any particular information word or one of the specified fourth number of trailing bit positions of the any particular information word, said at least one further specified bit position not coinciding with one of other specified bit positions.

30. Encoding method for encoding a sequence of (n-1)-bit information words into a sequence of n-bit channel words, the encoding method being carried out in the encoding arrangement as claimed in claim 1.

31. Decoding arrangement for decoding a channel signal of concatenated n-bit channel words into an information signal of concatenated (n-1)-bit information words, the channel signal being a bit sequence having the virtue that at most k 'zeros' between 'ones' occur, the decoding arrangement comprising:

input means for receiving the n-bit channel words;

reconverting means for reconverting the n-bit channel words into (n-1)-bit information words:

output means for supplying the (n-1)-bit information words, wherein the reconverting means comprises:

detection means for detecting a binary value in a specified first bit position in the n-bit channel words, and for supplying a first control signal upon detecting a logical 'one' value:

deleting means for deleting a specified second bit position in the n-bit channel words so as to obtain (n-1)-bit converted channel words, wherein the first specified bit position is the second specified bit position, the output means being adapted to supply the (n-1)-bit converted channel words as the (n-1)-bit information words upon occurrence of the first control signal for said converted channel words, and setting means for setting a logical value in a specified third bit position lying within a specified first number of leading bit positions in said converted channel word into a 'zero' value, or for setting a logical value in a specified fourth bit position lying within a specified second number of trailing bit positions in said converted channel word into a 'zero' value, or both, in the absence of the first control signal, so as to obtain an (n-1)-bit information word, the setting means supplying the (n-1)-bit information words to the output means in the absence of the first control signal, n and k being integer values.

32. Decoding arrangement as claimed in claim 31, wherein the detection means is further adapted to detect the binary values in specified fifth and sixth bit positions in the n-bit channel words, for supplying a second control signal upon detection of a logical 'one' value in said specified fifth bit position and a logical 'zero' value in said sixth bit position, the setting means being further adapted to reposition logical values present in seventh and eighth bit positions lying within said specified first number of leading bit positions to said fifth and sixth bit positions respectively and to set logical values in said seventh and eighth bit position to 'zero', said seventh and eighth bit positions not coinciding with said third bit position.

33. Decoding arrangement as claimed in claim 32, wherein the detection means is further adapted to supply a third control signal upon detection of a logical 'zero' value in said specified fifth bit position and a 'one' value in said specific sixth bit position, the setting means being further adapted to reposition logical values present in ninth and tenth bit positions lying within said specified second number of trailing bit positions to said fifth and sixth bit positions respectively and to set logical values in said ninth and tenth bit position to 'zero', said ninth and tenth bit positions not coinciding with said fourth bit position.

34. Decoding arrangement as claimed in claim 31, wherein n is an odd integer number and said first position is the central bit position in the channel word.

35. Decoding arrangement as claimed in claim 35, wherein the specified first number equals the specified second number and k=(n-1)/2.

36. Decoding arrangement as claimed in claim 33, wherein (n-1) is an integer multiple of 4, and the specified first number equals (n-1)/4.

37. Decoding arrangement as claimed in claim 31, wherein said third bit position is the leading bit position of the channel word, and said fourth bit position is the final bit position of the channel word.

38. Decoding arrangement as claimed in claim 31, wherein the specified first number equals the specified second number.

39. Decoding arrangement as claimed in claim 31, wherein k>{(n-1) div 2}/2.

40. Decoding arrangement as claimed in claim 31, wherein k >1 +entier(n/3), where entier(n/3) equals the smallest integer larger than or equal to n/3.

41. Decoding arrangement as claimed in claim 31, wherein k equals the sum of the first and the second specified numbers.

42. Decoding arrangement as claimed in claim 20, further comprising deshuffling means for carrying out a deshuffling step on the information words after decoding.

43. Decoding arrangement as claimed in claim 42, wherein the deshuffling step is such that bits stored in at least two bit positions in an information word that may have been affected by the setting means are repositioned in at least two neighbouring bit positions so as to obtain a deshuffled information word.

44. Decoding arrangement as claimed in claim 21, wherein the setting means is further adapted to set logical value in at least one further specified bit position into a 'one' value in the absence of the first control signal, the at least one further specified bit position being one of the specified third number of leading bit positions of the information words or one of the specified fourth number of trailing bit positions of the information words, said at least one further specified bit position not coinciding with one of the other specified bit positions.

45. Decoding method for decoding a sequence of n-bit channel words into a sequence of (n-1)-bit information words, the decoding method being carried out in the decoding arrangement as claimed in claim 31.

* * * * *